(12) United States Patent
Bittner et al.

(10) Patent No.: US 9,144,167 B2
(45) Date of Patent: Sep. 22, 2015

(54) FUSE BOX AND ELECTRICAL CUT-OFF DEVICE PROVIDED WITH SUCH A BOX

(75) Inventors: Anne-Charlotte Bittner, Erstein (FR); Victor Catusse, Selestat (FR); Roger Dumont, Benfeld (FR); Evelyne Grossiord, Saint-Maurice (FR)

(73) Assignee: Socomec S.A., Benfeld (FR)

( * ) Notice: Subject to any disclaimer, the term of this patent is extended or adjusted under 35 U.S.C. 154(b) by 247 days.

(21) Appl. No.: 13/640,511
(22) PCT Filed: Apr. 12, 2011
(86) PCT No.: PCT/IB2011/000802

§ 371 (c)(1),
(2), (4) Date: Dec. 31, 2012

(87) PCT Pub. No.: WO2011/128754

PCT Pub. Date: Oct. 20, 2011

(65) Prior Publication Data

US 2013/0201652 A1 Aug. 8, 2013

(30) Foreign Application Priority Data

Apr. 13, 2010 (FR) ...................................... 10 52793

(51) Int. Cl.
*H01H 85/22* (2006.01)
*H05K 7/02* (2006.01)
(Continued)

(52) U.S. Cl.
CPC ................ *H05K 7/02* (2013.01); *H01H 9/104* (2013.01); *H01H 85/547* (2013.01); *H01H 9/283* (2013.01); *H01H 2085/209* (2013.01)

(58) Field of Classification Search
CPC .......... H01H 9/104; H01H 2011/0025; H01H 2085/209; H01H 2300/048; H01H 71/56; H01H 85/547; H01H 9/102
USPC ......... 200/49, 50.07, 237; 361/833, 834, 835; 337/142, 143, 144, 146, 172, 173, 186, 337/201, 208, 210, 211, 213, 227, 228, 231, 337/234
See application file for complete search history.

(56) References Cited

U.S. PATENT DOCUMENTS 2,982,834 A 5/1961 Edmunds
5,590,019 A 12/1996 Fox et al.
(Continued)

FOREIGN PATENT DOCUMENTS

DE 44 41 209 C1 11/1994
DE 19600413 A1 7/1996
(Continued)

OTHER PUBLICATIONS

French Search Report for corresponding French Application No. 10/52793 filed Apr. 1, 2010.
(Continued)

*Primary Examiner* — Hung S. Bui
*Assistant Examiner* — James Wu
(74) *Attorney, Agent, or Firm* — Davis & Bujold, P.L.L.C.; Michael J. Bujold

(57) ABSTRACT

An electrical cut-off device (1) with a single cut-off which comprises fuse boxes (5) that are each provided with a fuse (50) connected in series with the single cut-off element. The fuse box is a separate element mounted onto the electrical cut-off device and comprises a handle (55) that is movable, relative to the electrical cut-off device, into a passive position where the fuse box is connected to the electrical cut-off device but not locked, the electrical cut-off device being in an open position, an active position wherein the fuse box is connected and locked to the electrical cut-off device, the electrical cut-off device is switchable between open and closed positions and an intermediate position where the fuse box is partially removed from the electrical cut-off device and forms a disconnected position. The electrical cut-off device being able to be padlocked, in the intermediate position, so that it is isolated, and the disconnected position of the contacts being visible to the operator through the fuse box.

17 Claims, 9 Drawing Sheets

(51) Int. Cl.
*H01H 9/10* (2006.01)
*H01H 85/54* (2006.01)
*H01H 85/20* (2006.01)
*H01H 9/28* (2006.01)

(56) References Cited

U.S. PATENT DOCUMENTS

| | | | |
|---|---|---|---|
| 6,650,222 B2 * | 11/2003 | Darr et al. | 337/187 |
| 6,727,797 B1 * | 4/2004 | Bruchmann | 337/210 |
| 7,561,017 B2 * | 7/2009 | Darr et al. | 337/79 |
| 2002/0092742 A1 | 7/2002 | Rohmer et al. | |
| 2009/0243786 A1 * | 10/2009 | Buettner | 337/203 |

FOREIGN PATENT DOCUMENTS

| | | |
|---|---|---|
| FR | 2 266 292 A1 | 3/1974 |
| FR | 2 890 781 A1 | 9/2005 |
| WO | 01/08180 A1 | 2/2001 |
| WO | 2007/031656 A1 | 3/2007 |
| WO | 2008-101111 A2 | 8/2008 |

OTHER PUBLICATIONS

International Search Report for corresponding PCT Application No. PCT/IB2011/00082 filed Apr. 12, 2011.
Written Opinion for corresponding PCT Application No. PCT/IB2011/00082 filed Apr. 12, 2011.

* cited by examiner

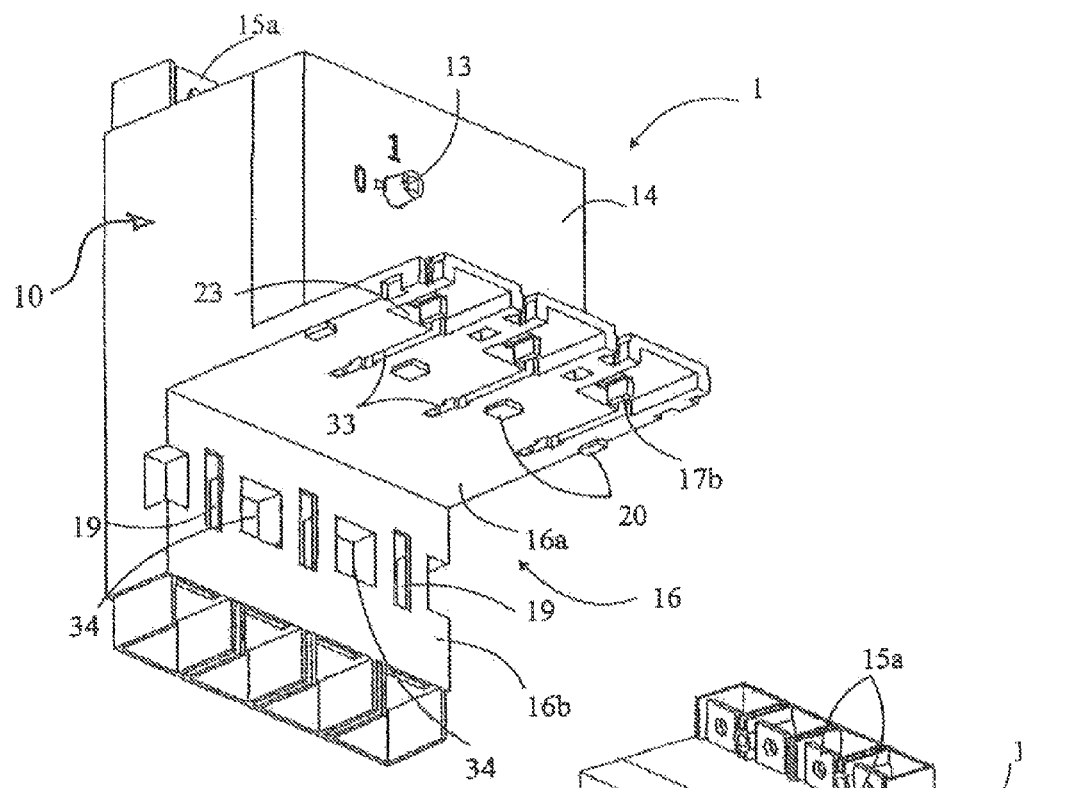
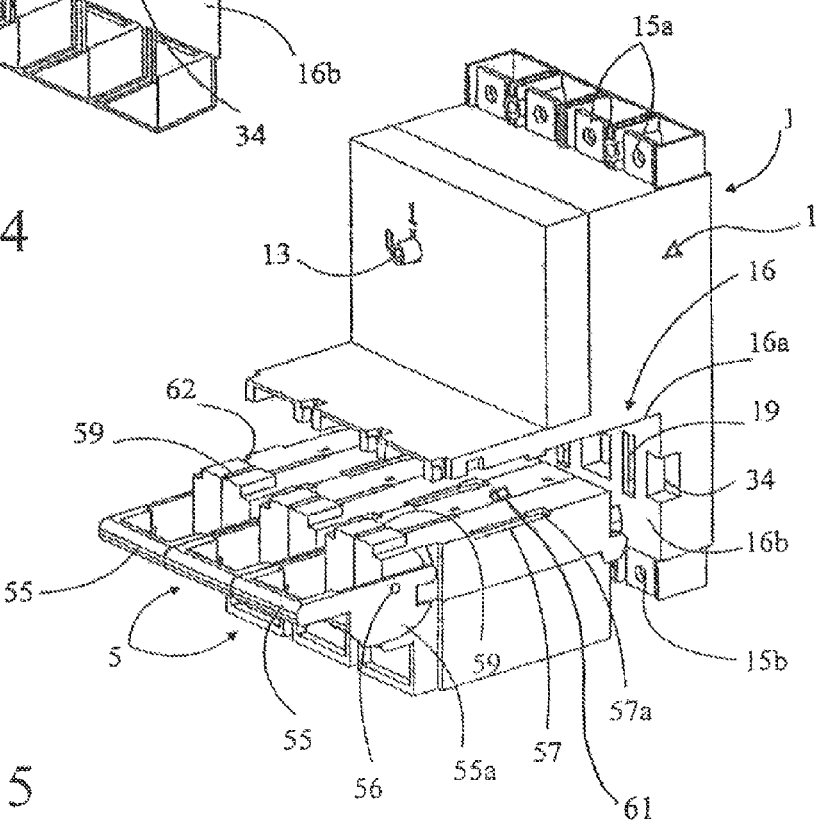
FIG. 4
FIG. 5

FUSE BOX AND ELECTRICAL CUT-OFF DEVICE PROVIDED WITH SUCH A BOX

This application is a National Stage completion of PCT/IB2011/000802 filed Apr. 12, 2011, which claims priority from French patent application serial no. 10/52793 filed Apr. 13, 2010.

FIELD OF THE INVENTION

The present invention relates to a fuse box for an electrical cut-off device, this device comprising an enclosure containing at least one pair of fixed electrical contacts associated with at least one moving electrical contact coupled with an operating device, said fuse box comprising an enclosure containing at least one fuse provided with connection areas arranged so as to be connected to the fixed contacts of said device through connection openings provided respectively in said box and in said device, said fuse box and said cut-off device having complementary fit-in shapes so as to be assembled together, so that the fuse box is a separate element mounted onto the electrical cut-off device, said fuse box comprising a handle arranged so as to move said fuse box into at least one passive position wherein it is connected to said cut-off device but not locked, said device being in an open position, an active position wherein it is connected and locked to said device, said device being able to be switched from an open position to a close position and vice versa.

The present invention also relates to an electrical cut-off device provided with such a fuse box.

BACKGROUND OF THE INVENTION

In the area of the distribution of electrical energy, one commonly uses electrical cut-off devices such as fused switches, fused isolating switches or similar, single-phase or multi-phase, in order to protect the electrical power supply of the industrial equipment located downstream of these cut-off devices. There are two architecture types. The fuse is located downstream of the switch, which is a single cut-off switch. The main disadvantage of this architecture lies in the fact that the access to the fuse is not protected, and that nothing prevents an operator from accessing the fuse when the switch is in the closed position, that is to say when the electrical circuit is closed. Furthermore, a voltage backfeed due to the load always remains possible, since no protection prevents it.

Another safer architecture provides mounting the fuse between the two cut-offs, which requires another switch type, i.e. a double cut-off switch, such as for example in publication FR 2 890 781 by the applicant. In this architecture, the fuse is totally isolated when the switch is in the open position, i.e. when the electrical circuit is open, thus protecting the operator. Nevertheless, the constraint of having to provide a double cut-off requires a high operating effort, implying a suitable actuation mechanism whose dimensions and production cost are higher than for a single cut-off. This kind of architecture is also illustrated in publications WO 01/08180 and DE 196 00 413, which describe fused isolating switches wherein the electrical cut-off performed at the level of the fuse is not visible and is not dissociated from the electrical contacts of the switch.

Furthermore, the switch-off devices have ratings that can vary from some ten to some hundred amperes and are thus provided with fuses whose size is chosen according to the rating of the device and of the national and/or international standards in force. Each fuse format distinguishes itself by its dimensions, the shape of its connection areas and its connection mode. There are therefore, for every fuse format, specific support elements for each cut-off device type, which makes the management of these multiple references complicated and costly. Publication FR 2 890 781 by the applicant offers an electrical cut-off device whose box is designed specially to house fuses with different formats, wherein this box has no visible cut-off and the fuses are not integrated in a removable cartridge.

SUMMARY OF THE INVENTION

The present invention aims to remedy these disadvantages by offering a fuse box and an electrical cut-off device provided with such box, ensuring optimal safety for the operator by offering him a visible electrical cut-off, while being suitable for a single cut-off switch, offering thus a cost-effective and space-saving solution. Another goal of the invention is to offer a fuse box compatible with several fuse formats and whose dimensions can suit several cut-off device types, allowing to cover a wide range of intensity ratings and thus to reduce the number of references to be produced and stored.

To that purpose, the invention relates to a fuse box of the kind described in the preamble, characterized in that the handle is arranged so as to move it into an intermediate position wherein it is partly removed from said device, which corresponds to a so-called disconnected position of the cut-off device wherein it cannot be closed, in that said fuse box comprises at least one connection element connected on one side to one of the connection areas of said fuse and on the other side to one of the fixed contacts of the device when the fuse box is in the active position, and in that said enclosure of said fuse box comprises at least one translucent section located in front of said connection element so as to visualize the electrical cut-off between said connection element and said fixed contact of the device when the fuse box is in its intermediate position.

To that purpose, it comprises advantageously safety means arranged so as to prevent the switching of said cut-off device into the closed position when the fuse box is not in its active position and conversely prevent the removal of the fuse box when the cut-off device is in its closed position.

The handle is preferably mobile on said fuse box between at least three positions, which correspond to the passive, active and intermediate positions of said fuse box.

In a preferred embodiment, it comprises means for padlocking said intermediate position, arranged so as to lock out said cut-off device, these padlocking means comprising at least one padlocking tab that can move in the box and is coupled with the handle so as to be placed in a position allowing padlocking the handle when the box is in the intermediate position.

The enclosure of the fuse box can be made of two half shells assembled with a hinge at one of their ends, the housing delimited by them being arranged so as to be able to house several fuse formats.

This goal is also achieved by an electrical cut-off device such as defined in the preamble, characterized in that is comprises a fuse box such as defined above, the fuse box and the cut-off device comprising each safety means arranged so as to cooperate and prevent the cut-off device from switching to the closed position when the fuse box is not in its active position, and conversely prevent the removal of the fuse box when the cut-off device is in its closed position.

The safety means comprise preferably, on the cut-off device, a striker coupled with the operating device of the moving electrical contacts and a bolt actuated by a return element in the direction of the striker in order to lock it and block the operating device in the open position and, on the fuse box, a stop cooperating with the bolt through locking openings provided at least in the device, so as to unlock the striker when the fuse box is in its active position and release the operating device. The connection and locking openings have preferably dimensions that do not allow introducing a finger.

The handle of the fuse box is preferably movable on said fuse box between at least three positions, which correspond to the passive, active and intermediate positions of said fuse box. It comprises advantageously at its free end a locking area arranged so as to fit into a complementary locking area provided on the cut-off device, when the fuse box is moved from its passive position to its active position. This handle can comprise at its free end a lever arranged so as to cooperate with a bearing surface provided on the cut-off device in order to remove the fuse box from the switch-off device, when the handle is moved from the active position to the intermediate position.

In case the cut-off device comprises at least two current lines, each current line being made of a pair of fixed contacts associated with a moving contact, a fuse box being assigned to each current line, the handles of the fuse boxes may be linked together or not.

In an embodiment variant, the operating device of the cut-off device can be coupled with the handle of the fuse box by movement transmission means in order to move the fuse box between at least its intermediate and active positions by actuating only the operating device between its open position and a third position called disconnected position. These movement transmission means can comprise at least one slide running in a cam groove, the slide and the cam groove being provided respectively on the cut-off device and on the fuse box or vice versa, the cam groove defining a path for the slide without effect on the fuse box in active position when the operating device switches between its closed and its open position, and a stop for the slide causing the displacement of said fuse box between its active and intermediate positions when the operating device switches between its open and its disconnected position.

BRIEF DESCRIPTION OF THE DRAWINGS

The present invention and its advantages will be better revealed in the following description of several embodiments given as non limiting examples, in reference to the drawings in appendix, wherein:

FIG. 4 is a perspective view of the cut-off device of FIG. 1 according to the invention, alone and without the fuse boxes, FIG. 5 is a perspective view of the cut-off device and of the fuse boxes of FIG. 1, in a first mounting phase, wherein the fuse boxes are brought close to the device.

DETAILED DESCRIPTION OF THE PREFERRED EMBODIMENTS

Figure 1:
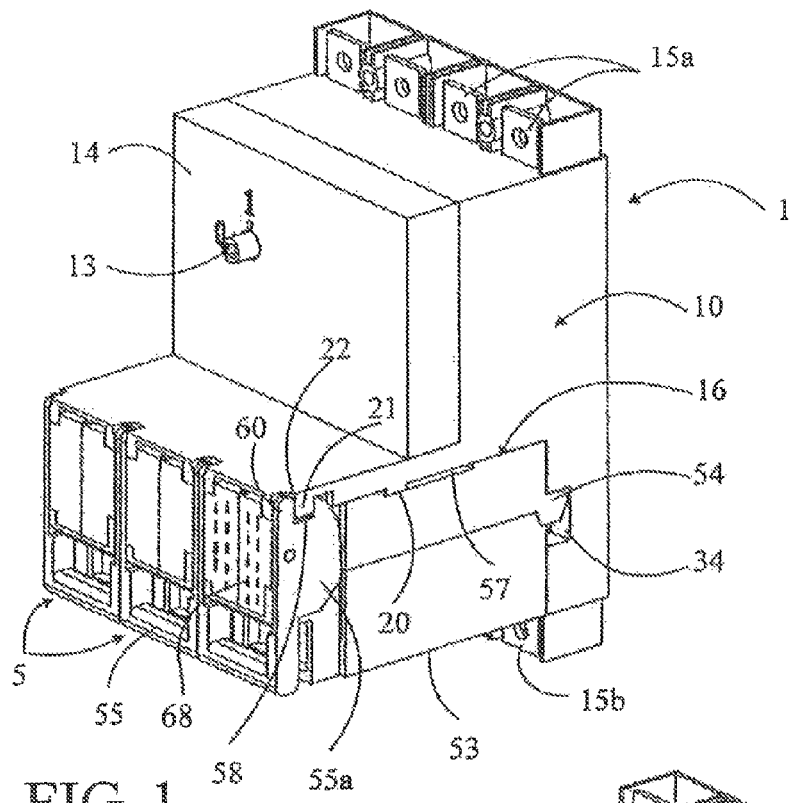
FIG. 1 is a perspective view of an electrical cut-off device provided with fuse boxes according to the invention, these fuse boxes being adjacent to the cut-off module.

Referring to the figures, fuse box 5 according to the invention is intended for equipping an electrical cut-off device 1 such as a fused switch, a fused isolating switch or similar, single-phase or multi-phase. The example represented in the figures relates to a four-pole switch intended for a three-phase power supply circuit with neutral. This switch comprises in a known way a cut-off module delimited by a closed enclosure 10 made out of an electrically insulating material, containing four current lines made of four pairs of fixed electrical contacts 11 and moving electrical contacts 12 coupled with a operating device 13, which can be a shaft mobile in rotation or in translation, operated manually by a (not represented) handle and/or automatically by a (not represented) motorized actuator, the handle and/or the actuator can be mounted on front side 14 of said device or on a side of said device. The fixed electrical contacts 11 end respectively with an upstream connection terminal 15a and a downstream connection terminal 15b that allow the electrical connection of cut-off device 1 to the electrical power supply circuit.

In the represented example, this cut-off device 1 is equipped with three fuse boxes 5 (see FIG. 1) mounted side by side in a receiving area 16 specifically provided for that purpose on front side 14 of the device, underneath the cut-off module, that is to say one fuse 50 per phase, the neutral being looped through, which corresponds approximately to 95% of the market. The three fuse boxes 5 could of course be replaced with one single box containing three fuses. Nevertheless, the solution as it is illustrated allows standardizing the fuse boxes 5 and offering high flexibility of use and modularity to suit different cut-off device formats, with one or several phases. Furthermore, the single-pole removal also allows, for high ratings, to limit the required removal effort. Likewise, the fuse boxes 5 may be positioned differently with respect to cut-off device 1, in particular in function of the global space requirement of cut-off device 1. In the example illustrated schematically in FIG. 12, the fuse boxes 5' are superimposed on the cut-off module, allowing to reduce the total height of cut-off device 1'.

In the configuration of FIG. 1, the receiving area 16 has the shape of an L delimited by an upper wall 16a and a rear wall 16b of the closed enclosure 10 (see FIG. 4). Since the receiving area 16 is located in the lower half of front side 14 of the device, the upper half of this front side 14 remains free to receive in particular a handle and/or a motorized actuator (both not represented) that will allow operating the operating device 13 of the moving electrical contacts 12 between an open position "0" and a closed position "1".

Figure 8:
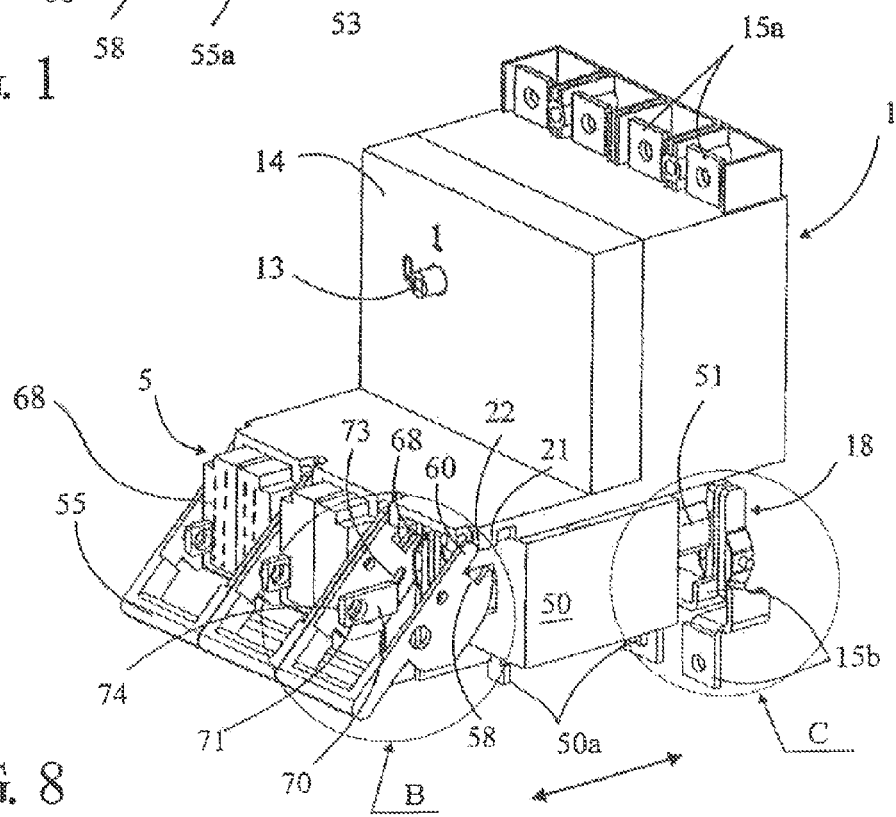
FIG. 8 is a view similar to FIG. 1, wherein the enclosure of the device and that of the fuse box have been removed in order to show the connection areas of the fuse and the fixed contacts of the device, with the fuse boxes in disconnected position.
Figure 2A:
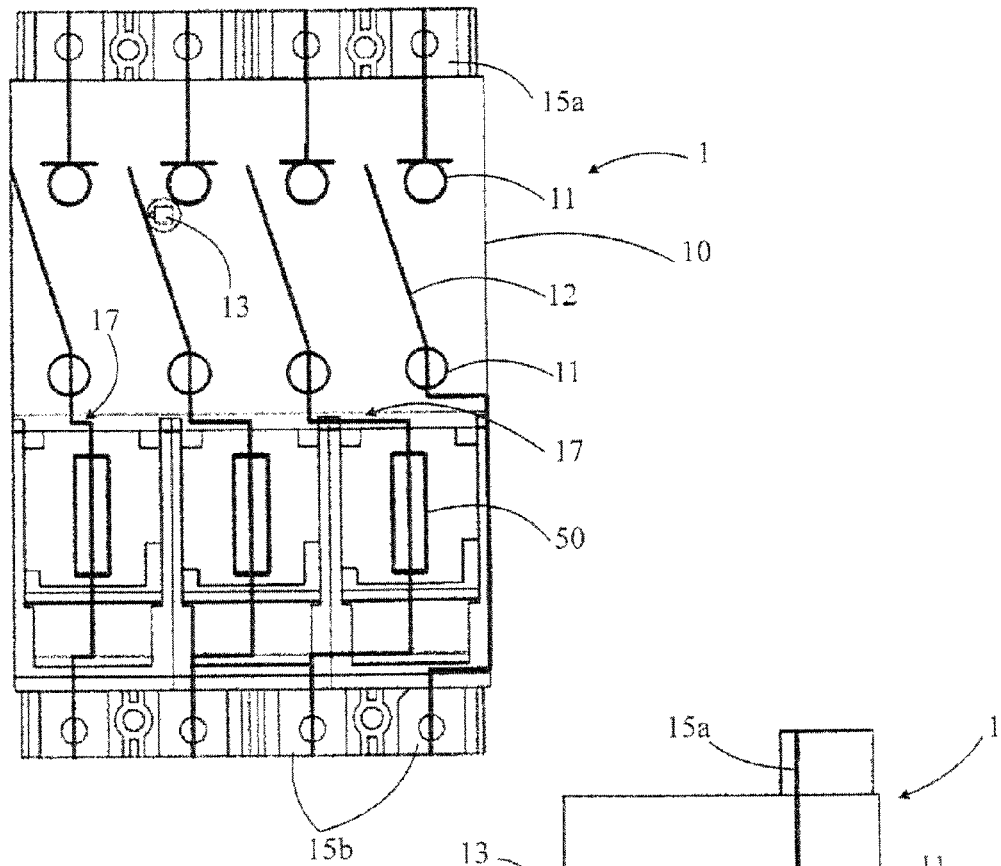
FIGS. 2A and 2B are diagrams of the electrical circuit of the cut-off device represented in FIG. 1, respectively in front view and in side view.
Figure 2B:
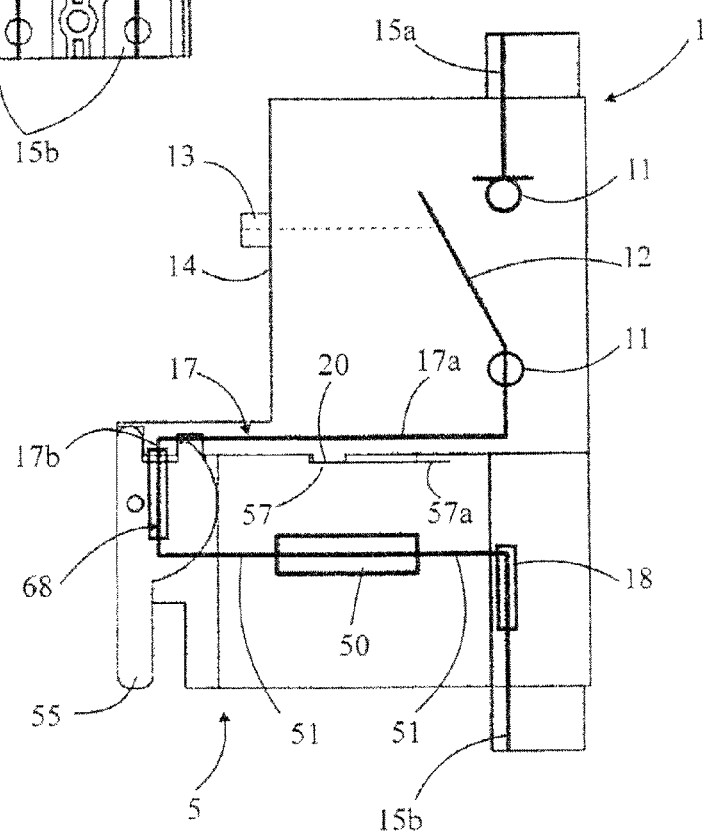
Figure 10:
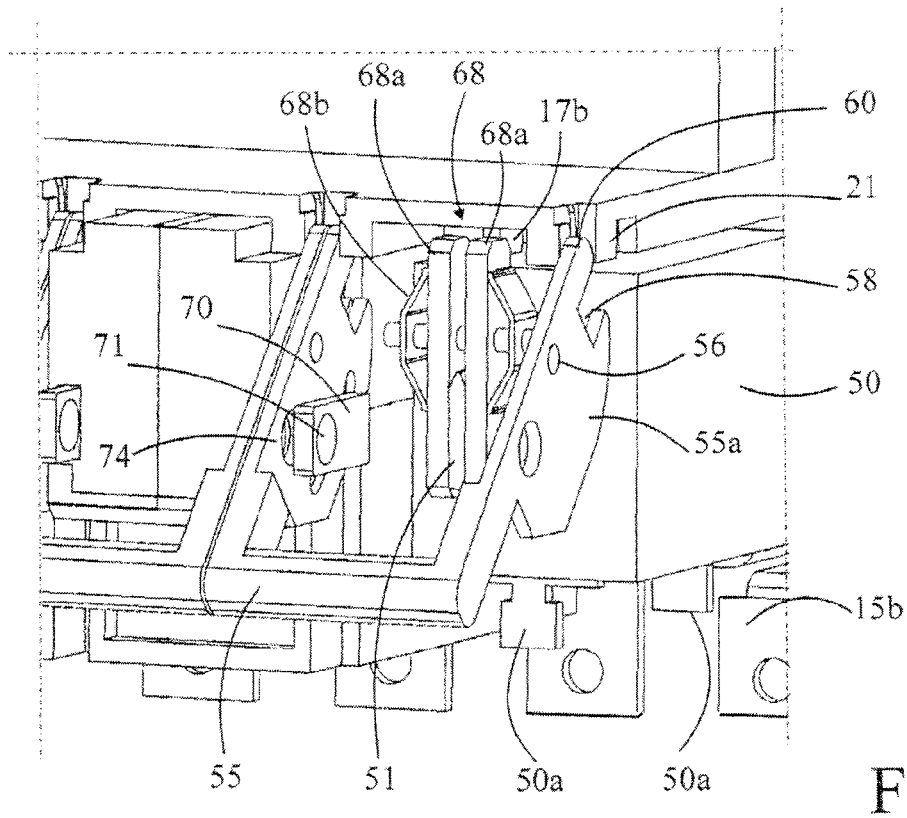
FIG. 10 is an enlarged view of detail B of FIG. 8 showing a fixed contact contained in the fuse box.
Figure 11:
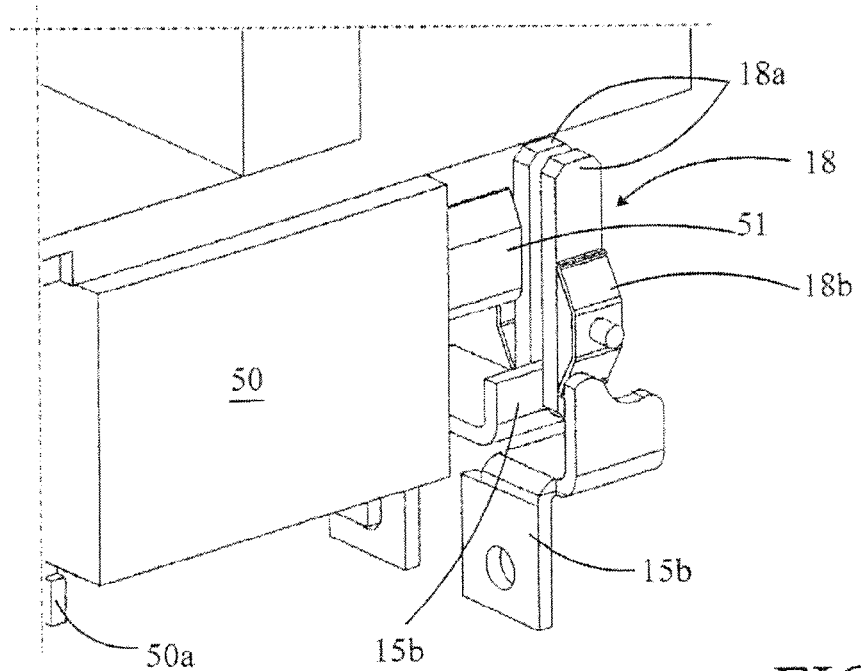
FIG. 11 is an enlarged view of detail C of FIG. 8 showing a fixed contact contained in the cut-off device.

The internal electrical circuit of cut-off device 1 provided with the fuse boxes 5 is shown schematically in FIGS. 2A and 2B. The fuses 50 are arranged downstream of the cut-off, which is a single cut-off, and are associated with safety means ensuring the safety of the operator when he is to service fuses 50. The single cut-off element, which comprises the pairs of fixed electrical contacts 11 associated with the moving electrical contacts 12, is located in the upper section of the device and is connected to the downstream connection terminals 15b by means of a conductor 17 in series with fuse 50. This conductor 17 includes a section 17a upstream of fuse 50 housed in the thickness of upper wall 16a of cut-off device 1, ending in receiving area 16 with a connection area 17b (see FIG. 2B and 4), and connected to said fuse 50 by a connecting element 68 located inside fuse box 5. The downstream connecting terminal 15b is connected to a connecting element 18 located behind rear wall 16b in cut-off device 1 (see FIGS. 2B and 8). These connecting elements 68 and 18, represented more in detail in FIGS. 10 and 11, comprise each two electrically conductive parallel blades 68a, 18a, pressed against each other by a return element 68b, 18b. They are connected on one side respectively to connecting area 17b and to said downstream connecting terminal 15b and, on the other side, to one of connecting areas 51 of fuse 50 through connection openings 59, 19 provided respectively in fuse box 5 and in rear wall 16b of cut-off device 1 (see FIGS. 4, 5, 10 and 11). The advantage of this embodiment lies in the fact that, when one of the sides is disconnected, the corresponding ends of the two blades 68a, 18a come closer under the effect of return element 68b, 18b, thus moving the opposite ends of the two blades 68a, 18a away from each other, which allows removing fuse 50 easier. Nevertheless, any other connecting element shape may be suitable.

Figure 12:
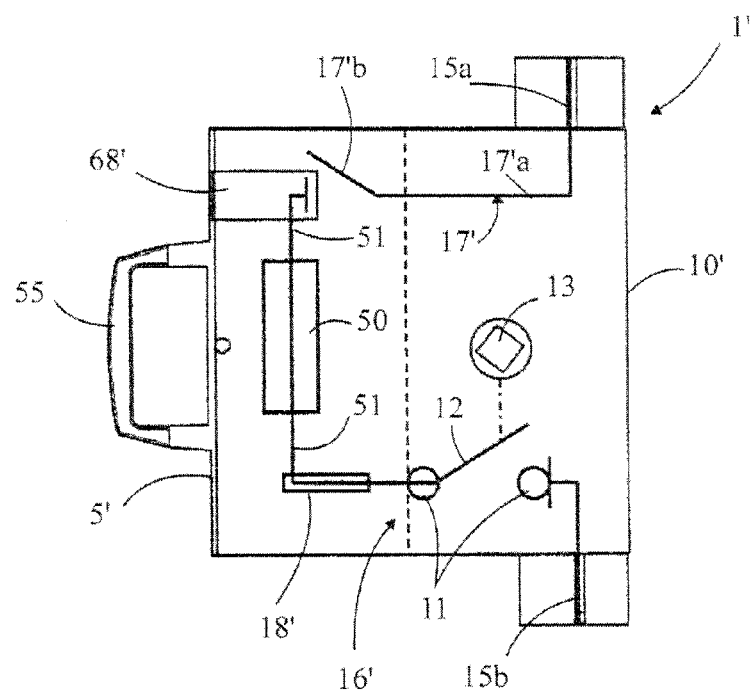
FIG. 12 is a diagram similar to FIG. 2B of the electrical circuit of a cut-off device according to a first embodiment variant of the invention, wherein the fuse boxes are superimposed on the cut-off module.

In cut-off device 1' according to the configuration of FIG. 12, the fuses 50 are arranged upstream of the single cut-off element and superimposed on the cut-off module, on the front side of the device. The single cut-off element comprises, as in the previous example, pairs of fixed electrical contacts 11 associated with the moving electrical contacts 12. It is connected to the upstream connecting terminals 15a by means of a conductor 17' in series with fuse 50. This conductor 17' includes a section 17'a upstream of fuse 50, housed in enclosure 10' of the device and ending in reception area 16' with a connecting area 17'b (represented by the symbol of an isolating switch) and connected to said fuse 50 by means of a connecting element 18'. The fixed downstream electrical contact 11 is connected to a connecting element 18' housed in fuse box 5'. These connecting elements 18' are connected on one side to one of connecting areas 51 of fuse 50 and on the other side respectively to connecting area 17'b and to fixed contact 11 through connection openings provided respectively in fuse box 5' and in cut-off device 1'.

Fuse box 5, 5' comprises a closed enclosure 53 made out of an electrically insulating material, delimiting at least one housing for at least one fuse 50 provided with connecting areas 51 intended for being connected to the fixed contacts 11 of cut-off device 1, 1' through connection openings 59, 19 provided respectively in the box and in the device, by means respectively of conductor 17, 17' and of connecting elements 18, 18'. This fuse 50 includes mounting lugs 50a to allow mounting it in fuse box 5, 5'. At least the section of enclosure 53 located on the front side of cut-off device 1 can be made out of an at least translucent material such as polycarbonate, so as to allow the operator to see at least one of the connecting elements 18, 18' located in fuse box 5, 5' and thus visualize the electrical cut-off between this connecting element 18, 18' and connecting area 17b, 17'b in particular when fuse box 5, 5' is in its disconnected position. This principle of a visible cut-off connected in series to the electrical contacts 11, 12 of cut-off device 1, 1', but which is dissociated from said electrical contacts 11, 12 of the device, allows ensuring in time the visibility of the open contacts, since there is no pollution due to the cut-off at this location. Furthermore, this configuration prevents from an always possible arc flash, which would be dangerous in case of a direct view on the electrical contacts of the device.

Figure 3A:
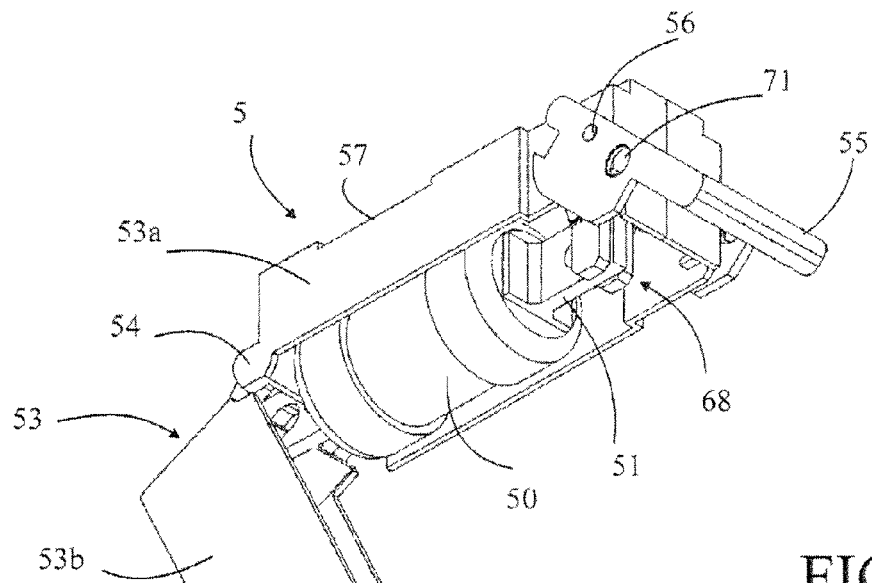
FIGS. 3A and 3B are perspective views of a fuse box mounted on the cut-off device of FIG. 1, provided respectively with a fuse in the BS-UL and DIN format.
Figure 3B:
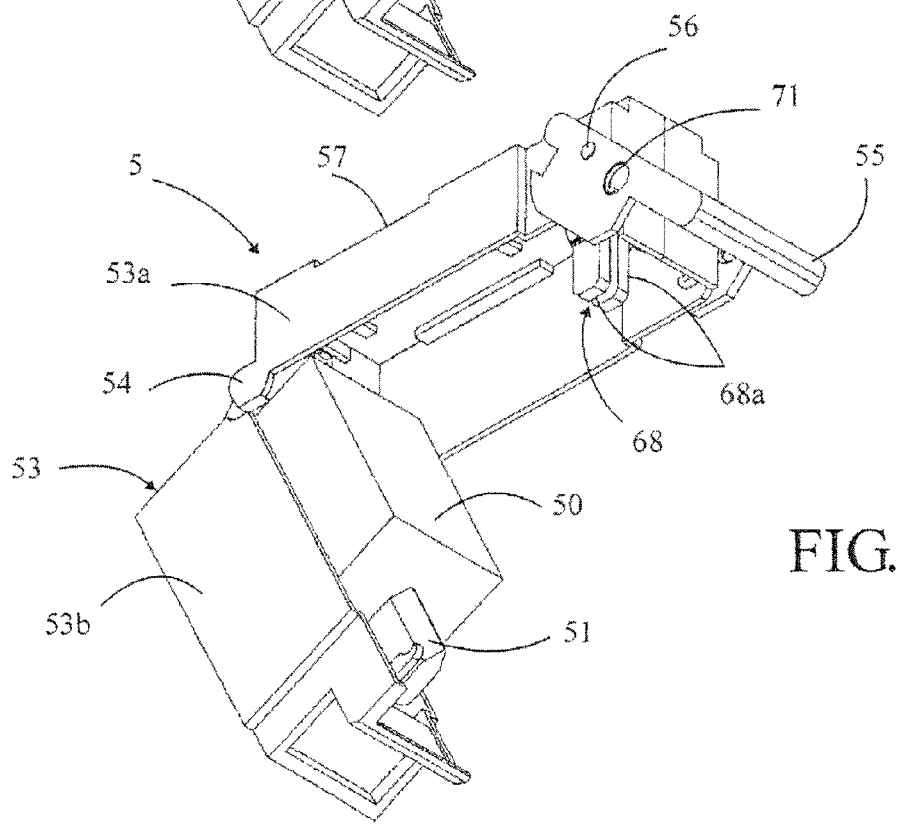

In the example represented in FIGS. 3A and 3B, the enclosure 53 of fuse box 5 is made of two half shells 53a, 53b assembled at the rear end by means of a hinge 54 and closed at the front by any suitable closing means. Any other configuration may be considered. The construction of fuse box 5 and its dimensions have been chosen so as to make it compatible with the standard fuse formats existing on the market, such as a BS-UL format in FIG. 3A and a DIN format in FIG. 3B, these examples being not limitative. Mounting three fuses 50 on four current lines allows thus using standard fuses 50, which have an imposed width, and furthermore suiting 95% of the applications, since protecting the neutral is not often required, the width of a four-pole device having been chosen so as to correspond to the standard dimensions of the mounting systems. In the event of a diminution of the width in particular of the fuses 50, the invention would allow mounting four fuses on four current lines. The fuse box 5 thus allows an evolution of the product and reduces the number of references to produce and to keep in stock.

This fuse box 5, 5' is a separate element mounted onto cut-off device 1, 1', and is entirely removable. It can thus be offered for sale as a spare part.

Figure 6A:
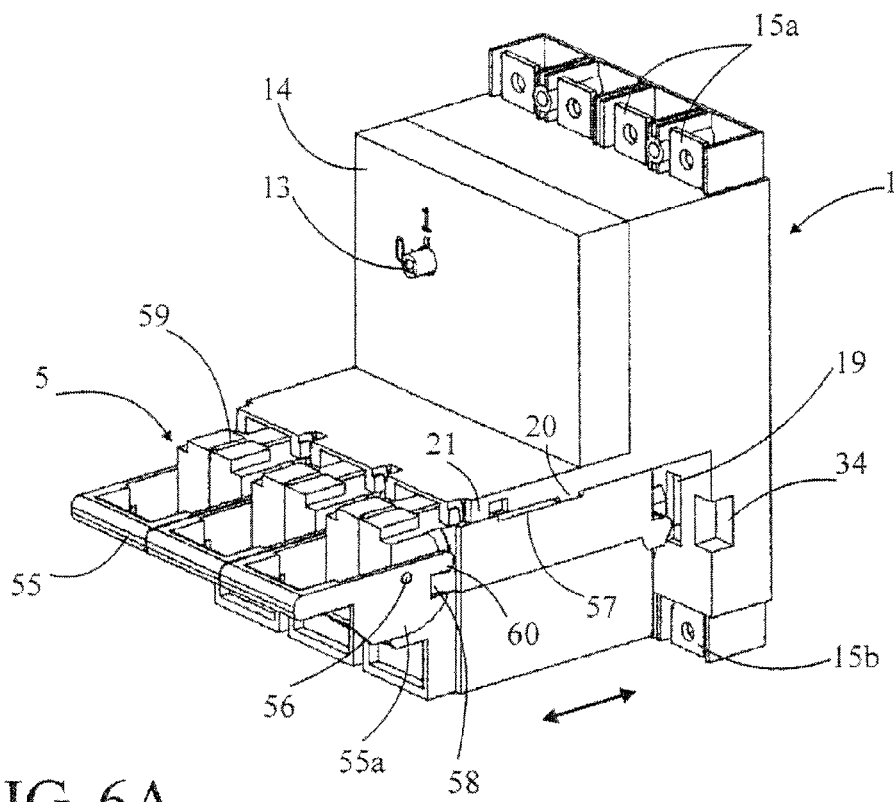
FIG. 6A is a view similar to FIG. 5
Figure 6B:
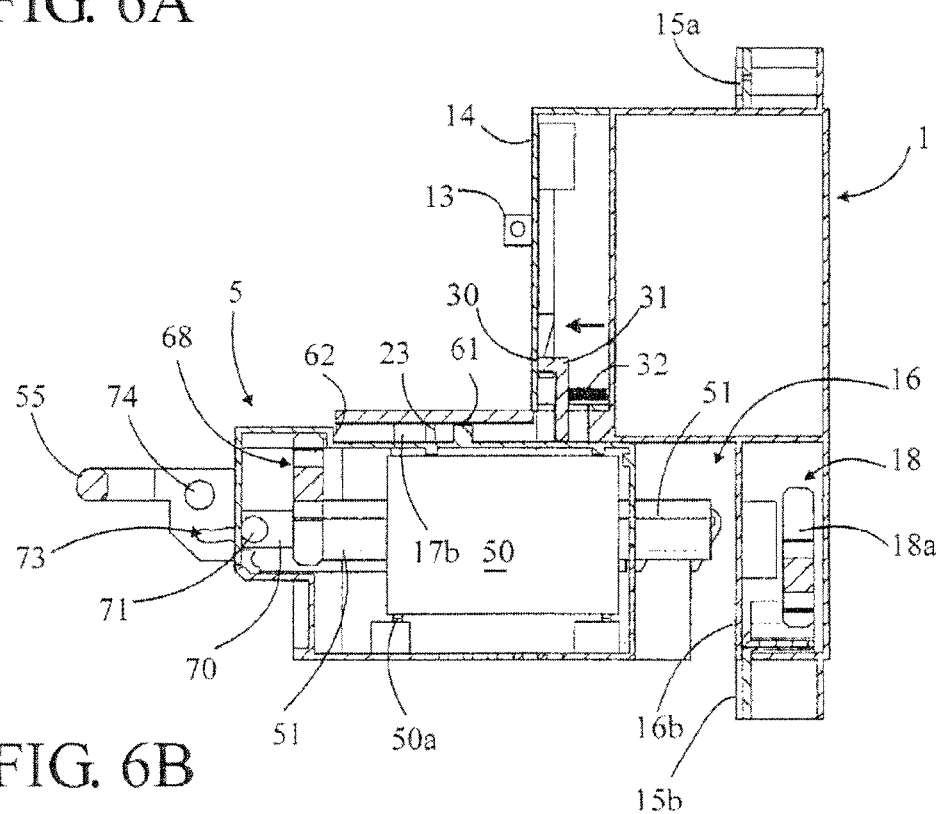
FIG. 6B is a cross-sectional view of the device of FIG. 6A, in a second mounting phase, wherein the fuse boxes are fitted on the device, but are not connected electrically.
Figure 7A:
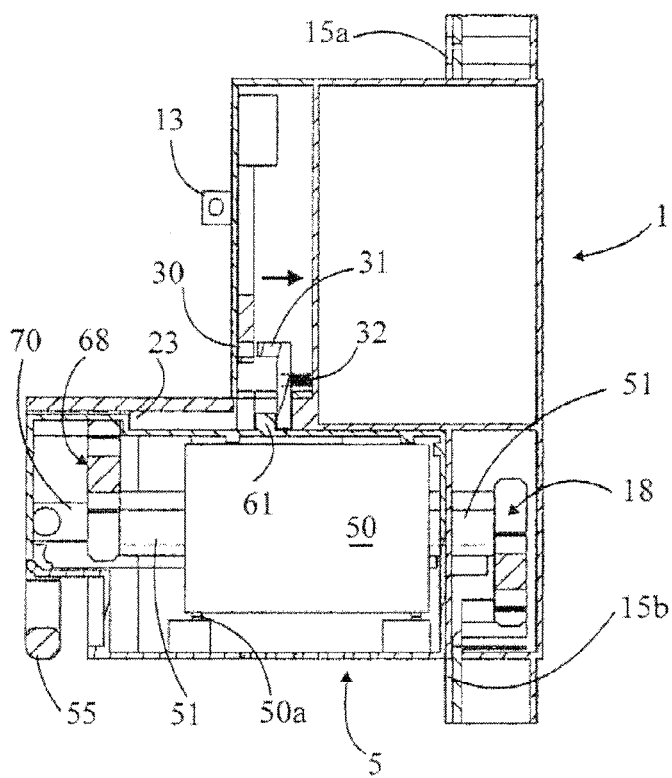
FIGS. 7A and 7B are cross-sectional views of the device of FIG. 1, wherein the fuse boxes are mounted on the device and connected electrically, the device being respectively in its open position "0" and in its closed position "1"
Figure 7B:
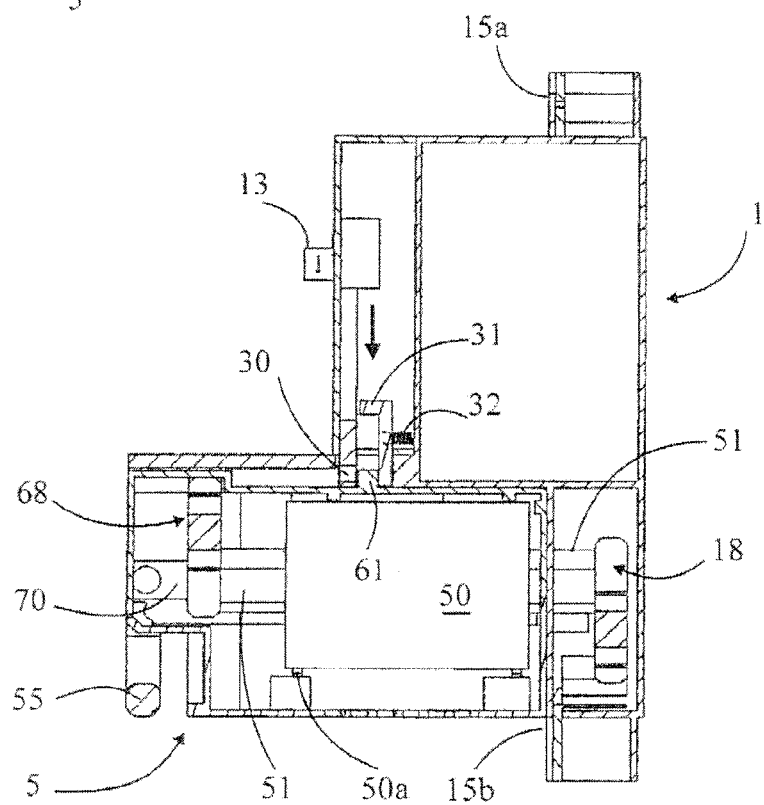

The fuse box 5' 5' as it is represented comprises on the front a handle 55 mounted so as to rotate around a pivot 56. It can move on for example 90° and allows moving fuse box 5, 5' with respect to cut-off device 1, 1' in at least three positions, that is to say a passive position (see FIGS. 6A, 6B) wherein it is connected to cut-off device 1 but not locked, said device being in the open position, an active position (see FIGS. 1, 7A and 7B) wherein it is connected and locked to cut-off device 1, said device being able to switch from an open position to a closed position and vice versa, and an intermediate position (see FIGS. 8, 9A) wherein it is partly removed from cut-off device 1, which corresponds to a so-called disconnected position of the cut-off device wherein said device cannot be closed. As it will be shown later, this handle 55 allows operating fuse box 5 simply, with a reduced effort for the operator and without tools. This embodiment is not limitative since handle 55 may be mobile with respect to fuse box 5, 5' by other technical means allowing its displacement as well in translation as according to a combined rotation/translation movement.

As a complement to handle 55, fuse box 5 comprises fitting shapes complementary to those provided in receiving area 16 of cut-off device 1 so as to be assembled, guided and locked on it. Fuse box 5 is guided in translation between its different passive, active and intermediate positions thanks to at least one dovetail-shaped groove 57 provided with a widened entry area 57a, which receives a boss 20 with a complementary shape provided on upper wall 16a of cut-off device 1 and sliding in groove 57 when fuse box 5 is moved. Any equivalent guide shape may of course be suitable. Fuse box 5 is locked in its active position with respect to cut-off device 1 thanks to, on the one hand, a translation stop delimited by two shoulders 23, 62 provided respectively on the device and on the box (FIGS. 4 and 5) and, on the other hand, to a locking catch 58 provided at the free end of sides 55a of handle 55 and arranged so as to fit on a complementary locking tooth 21 provided on cut-off device 1, when fuse box 5 is moved from its passive position to its active position (see FIG. 1). Any equivalent locking form may of course be suitable. Fuse box 5 can be removed from said device easily and without tooling, thanks to a lever 60 also provided at the free end of sides 55a of handle 55 and arranged to cooperate with a bearing surface 22 provided on cut-off device 1 when handle 55 is operated from the active position to the intermediate position (see FIG. 8). Also here, any equivalent embodiment may be suitable. Finally, the rear wall 16b of cut-off device 1 comprises recesses 34 to house the hinges 54 of fuse boxes 5.

Fuse box 5 and cut-off device 1 comprise each safety means arranged so as to cooperate and prevent cut-off device 1 from switching to the closed position "1" when fuse box 5 is not in active position and, conversely, prevent fuse box 5 from being removed when cut-off device 1 is in closed position. In the represented example, the safety means provided in cut-off device 1 comprise on the one hand a striker 30 coupled to operating device 13 of moving electrical contacts 12, this striker being able to move in vertical translation on the back of front side 14 of the device between a high position corresponding to the open position "0" and a low position corresponding to the closed position "1" of cut-off device 1 and, on the other hand, a bolt 31 actuated by a return element 32 towards striker 30 in order to lock it and block operating device 13 in open position "0". The safety means provided in fuse box 5 comprise a stop 61, protruding from said box and arranged so as to cooperate with bolt 31 through locking openings 33 (see FIG. 4) provided in upper wall 16a in order to unlock striker 30 when fuse box 5 is in its active position and release operating device 13. in order to prevent the operator against any electrical contact, the connection openings 19, 59 and the locking openings 33 have dimensions that do not allow introducing a finger so as to protect the operator (protection rating IP2) and avoid any fraud on the locking system. Operating only one fuse box 5 allows locking operating device 13.

Figure 9A:
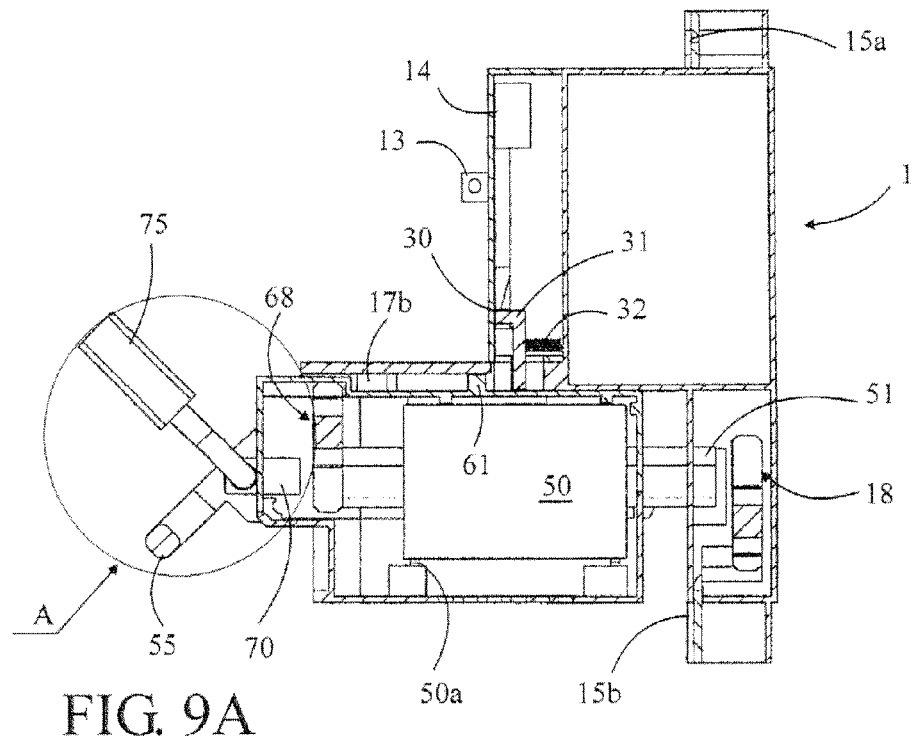
FIG. 9A is a view similar to FIG. 8, wherein the disconnected position is padlocked.
Figure 9B:
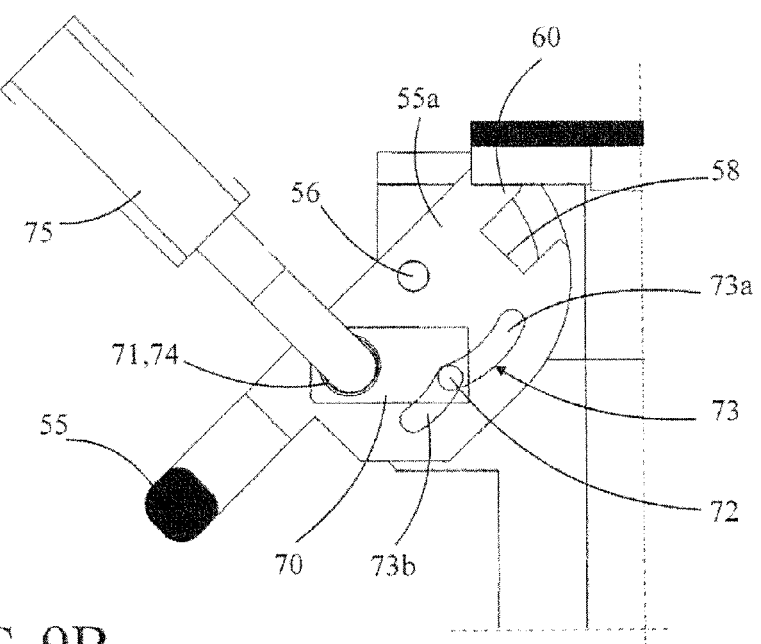
FIG. 9B is an enlarged view of detail A of FIG. 9A.

Referring to FIGS. 9A and 9B, fuse box 5 also comprises means for padlocking the intermediate position arranged so as to allow an operator to lock out cut-off device 1 in order to be able to service safely the equipment located downstream, the operator keeping to that purpose the key of the padlock with him. These padlocking means comprise, in the represented example, at least one padlocking tab 70 provided with a first padlocking opening 71, this tab being adjacent to a side 55a of handle 55 and guided in translation in fuse box 5. It is coupled to handle 55 by means of a pin 72 running in a cam groove 73 provided in side 55a in order to move padlocking tab 70 from a retracted position, wherein padlocking opening 71 is not accessible, to an extended position, wherein padlocking opening 71 is aligned with a second padlocking opening 74 provided in side 55a, allowing to lock handle 55 with a padlock 75 when the box is in intermediate position. Cam groove 73 is made of a groove arranged in side 55a of handle 55 and comprises a first curved section 73a centered on pivot 56 and having no effect on padlocking tab 70, followed by a second curved section 73b centered on an axis located ahead of pivot 56 outside of fuse box 5 and causing padlocking tab 70 to extend, when handle 55 turns by about 45°, in the represented example, to remove fuse box 5 from its active position to its intermediate position. In the represented case, wherein several fuse boxes 5 are arranged side by side, padlock 75 may be mounted on two adjacent handles 55. It is likewise possible to connect the handles 55 to each other by means of a transversal shaft or any equivalent means, so as to operate them simultaneously. Nevertheless, this possibility is in no case an obligation.

The operation of cut-off device 1 provided with fuse boxes 5 is very simple and totally safe for the operator. To mount each fuse box 5 on cut-off device 1, the operator holds it by its handle 55 in horizontal position and locates it in receiving area 16 of the device by moving it upwards (see FIG. 5) to fit the bosses 20 in the entry area 57a of grooves 57, then he moves it in translation (see FIG. 6A and 6B) towards rear wall 16b by the action of handle 55, the bosses 20 sliding in grooves 57 until he meets a resistance when connecting area 51 of fuse 50 that protrudes at the rear of fuse box 5 abuts against connecting element 18 through connection opening 19. Fuse box 5 is still in passive position and cut-off device 1 cannot be closed, since bolt 31 is housed in striker 30 (see FIG. 6B), blocking operating device 13 in the open position.

To bring fuse box 5 in its active position, the operator has to connect fuse 50 to the contacts of the device. To do so, he continues turning handle 55 downwards while pushing fuse box 5 to make it move forward and fit connecting area 51 that protrudes at the back of fuse box 5 into connecting part 18, and simultaneously the upper section of connecting element 68 of fuse box 5 on connecting area 17b through connection opening 59. He is assisted by lever 60 of the handle, which is turning on bearing surface 22 of the device. At the end position, locking catch 58 of the handle fits on locking tooth 21 (see FIG. 1), locking fuse box 5 in active position. In parallel, stop 61 pushed bolt 31 that came out of striker 30, releasing operating device 13 (see FIG. 7A), which can now be operated so as to switch cut-off device 1 to its closed position (see FIG. 7B). The operator cannot remove a fuse box 5 as long as cut-off device 1 is in closed position (see FIG. 7B), since striker 30 moved down and positioned in front of stop 61, preventing any removal of fuse box 5.

To switch cut-off device 1 to the disconnected position, he first has to switch cut-off device 1 to the open position so as to be able, with the help of handle 55 that is turned upwards by the operator, to remove partly fuse box 5 without effort and without tooling. He is assisted by lever 60, which turns on bearing surface 21 (see FIG. 8). At the end position, padlocking tab 70 extends and padlocking openings 71, 74 are aligned so as to allow to lock out cut-off device 1 by means of a padlock 75 (see FIG. 9A and 9B). The operator can check the disconnected position of the electrical contacts through the translucent front section of the box, in particular by checking the electrical cut-off between connecting element 68, 68' and the fixed contact of the device, via its connecting area 17b, 17'b. He can thus work safely on the load. If he is to replace a fuse 50, he removes entirely fuse box 5.

Figure 13A:
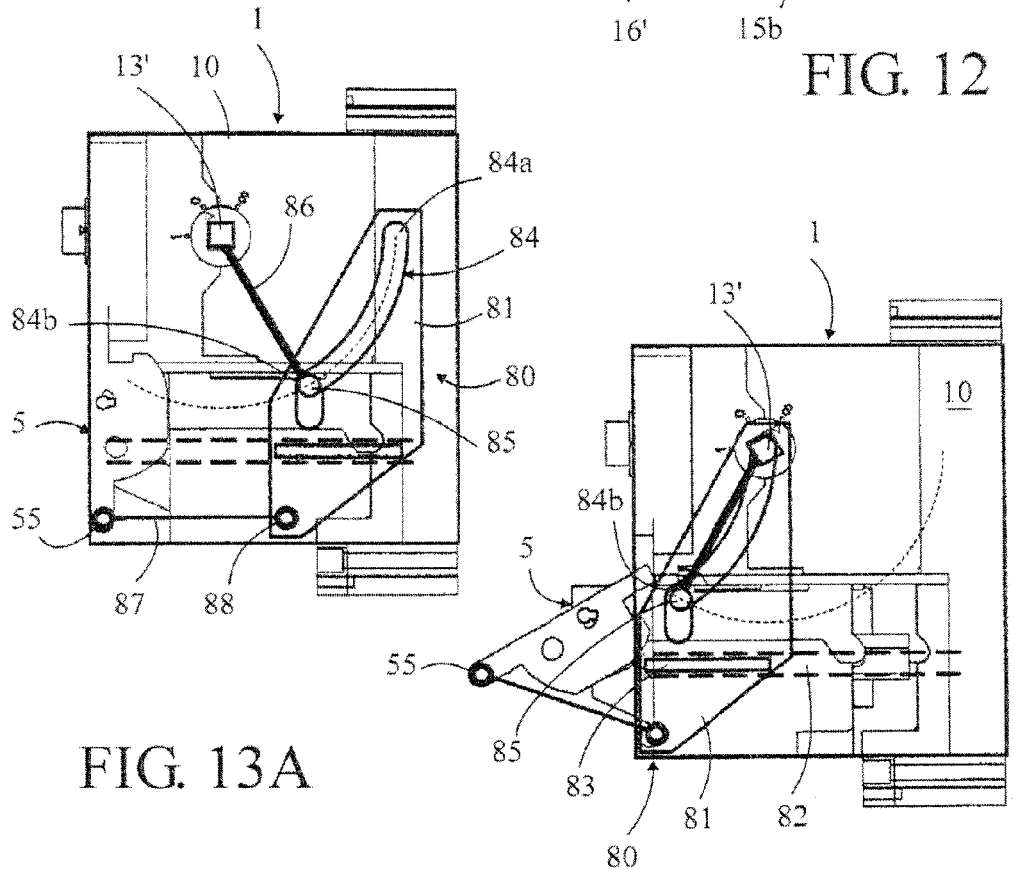
FIGS. 13A and 13B are side views of a cut-off device according to a second embodiment variant, wherein the operating device of the cut-off module also controls the displacement of the fuse boxes.
Figure 13B:
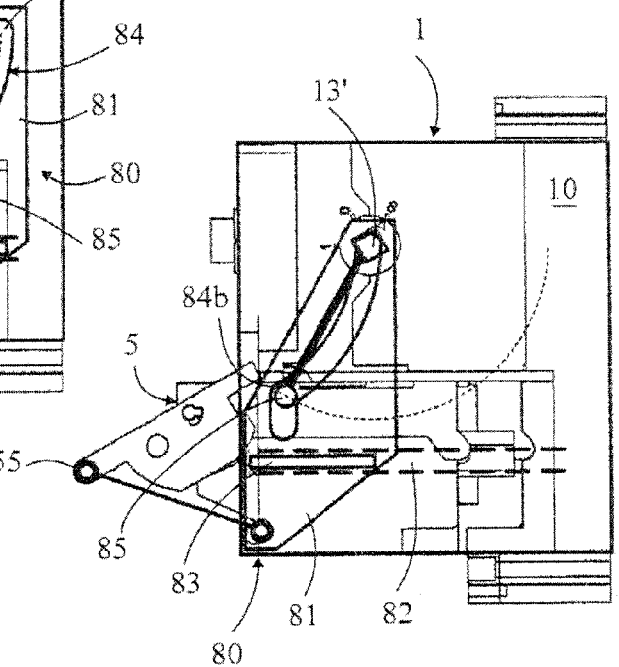

The so-called disconnected position of fuse boxes 5 can be reached by means of the operating device of the cut-off device for example by turning the handle beyond the open position "0" or by having the motor turn in the opposite direction, by means of a suitable mechanism. An embodiment example is illustrated in FIGS. 13A and 13B, wherein the operating device 13' of the movable electrical contacts 12 of cut-off device 1 is coupled with handle 55 of fuse box 5 by movement transmission means 80 arranged so as to move fuse box 5 between its intermediate and active positions and vice versa by operating only operating device 13'. In this variant, operating device 13' may be placed in three angular positions: a central open position (marked 0), a closed position (marked 1) by means of a counter-clockwise rotation, and a disconnected position (marked S) by means of a clockwise rotation.

The movement transmission means 80 comprise at least one flange 81 and preferably two flanges 81 installed on either side of cut-off device 1 and guided in translation by a rail 82 provided in enclosure 10 and wherein a rib 83 provided on flanges 81 is sliding. Each flange 81 comprises a cam groove 84 made of a circular groove 84a centered on the rotational axis of operating device 13' and extending over an angular sector defined by the stroke of operating device 13' between its open and its closed position, that is to say for example 60°. A slide 85 coupled to operating device 13' by means of a transmission arm 86 runs in cam groove 84. Furthermore, each flange 81 is coupled to handle 55 of fuse box 5 by means of a transmission rod 87 articulated around a pivot 88 of the flange. When fuse box 5 is in active position (see FIG. 13A), the operating device 13' can be switched freely between its open and closed positions, without effect on fuse box 5, since slide 85 runs in circular groove 84a. When operating device 13' is switched to its disconnected position (see FIG. 13B), slide 85, abutting against the left end of circular groove 84a, will move flanges 81 in translation with respect to cut-off device 1, leading to the rotation of handle 55 of fuse box 5 via transmission rod 87 and consequently to the movement of said box from its active position to its disconnected position. These transmission means 80 are of course given as an example and may be replaced with any equivalent mechanical means.

This description shows clearly that the invention allows reaching the goals defined, that is to say offer the operator a safe, easy-to-use, scalable and economic fused cut-off device solution.

The present invention is not restricted to the examples of embodiment described, but extends to any modification and variant which is obvious to a person skilled in the art while remaining within the scope of the protection defined by this invention. In particular, the fuses may be replaced with conductive bars if the client wishes the safe cut-off function in the switch function without fuse protection.

The invention claimed is:

1. A fuse box for an electrical cut-off device, this electrical cut-off device comprising a closed enclosure of the electrical cut-off device containing at least one pair of fixed electrical contacts associated with at least one moving electrical contact coupled with an operating device and a receiving area to receive the fuse box, the fuse box comprising a closed enclosure of the fuse box containing at least one fuse provided with connection areas arranged so as to be connected to the fixed electrical contacts of the electrical cut-off device through connection openings provided respectively in the fuse box and in the electrical cut-off device, the fuse box and the electrical cut-off device having complementary fit-in shapes so as to be assembled together so that the fuse box is a separate element being mountable on the electrical cut-off device and is entirely removable, the fuse box comprising a handle arranged so as to move the fuse box into at least one passive position where it is connected to the electrical cut-off device but not locked and the electrical cut-off device is in an open position, and an active position where the fuse box is connected and locked to the electrical cut-off device, and the electrical cut-off device is able to be switched from the open position to a closed position and vice-versa, wherein the handle is arranged so as to move the fuse box into an intermediate position, located between the passive and the active positions where the fuse box is partly removed from the electrical cut-off device, such position corresponds to a disconnected position of the electrical cut-off device where the electrical cut-off device cannot be closed, wherein the fuse box comprises at least one connection element located inside the enclosure and connected, on one side, to one of the connection areas of the fuse and intended to be connected, on the other side, to one of the fixed contacts of the electrical cut-off device through the connection opening when the fuse box is in the active position, and the enclosure of the fuse box comprises at least one translucent section located in front of the connection element to see the connection element so as to visualize the electrical cut-off between the connection element and the fixed electrical contact of the electrical cut-off device when the fuse box is in its intermediate position.

2. The fuse box according to claim 1, wherein the fuse box comprises safety means arranged so as to prevent switching of the cut-off device into the closed position, when the fuse box is not in the active position, and conversely prevent the removal of the fuse box, when the cut-off device is in closed position.

3. The fuse box according to claim 1, wherein the handle is movable on the fuse box between at least three positions, which correspond to the passive, the active and the intermediate positions of the fuse box.

4. The fuse box according to claim 3, wherein the fuse box comprises means for padlocking the intermediate position arranged so as to be able to lock out the cut-off device.

5. The fuse box according to claim 4, wherein the padlocking means comprise at least one padlocking tab that can move in the box and is coupled with the handle so as to be placed in a position allowing padlocking of the handle when the fuse box is in the intermediate position.

6. The fuse box according to claim 1, wherein the enclosure of the fuse box is made as two half shells assembled with a hinge at one of their ends, and a housing delimited by the two half shells is arranged so as to house several fuse formats.

7. An electrical cut-off device comprising a closed enclosure of the electrical cut-off device containing at least one pair of fixed electrical contacts associated with at least one moving electrical contact coupled with an operating device; and a receiving area to receive at least one fuse box, the at least one fuse box comprising a closed enclosure of the fuse box containing at least one fuse provided with connection areas arranged so as to be connected to the fixed electrical contacts of the electrical cut-off device through connection openings provided respectively in the fuse box and in the electrical cut-off device, the fuse box and the electrical cut-off device having complementary fit-in shapes so as to be assembled together so that the fuse box is a separate element mounted onto the electrical cut-off device and is entirely removable, and the fuse box comprising a handle arranged so as to move the fuse box, with respect to the cut-off device, into at least one passive position where the fuse box is connected to the electrical cut-off device but not locked and the electrical cut-off device is in an open position, and an active position where the fuse box is connected and locked to the electrical cut-off device and the electrical cut-off device is switchable from the open position to the closed position and vice-versa, wherein the handle is arranged so as to move the fuse box into an intermediate position, located between the passive and the active positions, where the fuse box is partly removed from the electrical cut-off device, this position corresponds to a disconnected position of the electrical cut-off device wherein the electrical cut-off device cannot be closed, wherein the fuse box comprises at least one connection element located inside the enclosure of the fuse box and connected, on one side, to one of the connection areas of the fuse and, on the other side, to one of the fixed electrical contacts of the electrical cut-off device through the connection enclosure when the fuse box is in the active position, and the enclosure of the fuse box comprises at least one translucent section located in front of the connection element to see the connection element so as to visualize the electrical cut-off between the connection element and the fixed electrical contact of the electrical cut-off device, when the fuse box is in its intermediate position.

8. The cut-off device according to claim 7, wherein the fuse box and the cut-off device each comprise safety means arranged so as to cooperate and prevent the cut-off device from switching to the closed position, when the fuse box is not in active position, and, conversely, prevent the fuse box from being removed, when the cut-off device is in the closed position.

9. The cut-off device according to claim 8, wherein the safety means comprises at least one striker, on the cutoff device, coupled with an operating device of the movable electrical contacts and a bolt actuated by a return element, in a direction of the striker, in order to lock it and block operating device in the open position and a stop, on the fuse box, cooperates with the bolt through locking openings provided at least in the device, to unlock striker when fuse box is in its active position and release operating device.

10. The cut-off device according to claim 9, wherein the connection and locking openings have dimensions that prevent introduction of a finger of an operator therein.

11. The cut-off device according to claim 7, wherein the handle is movable on the fuse box between at least three positions which correspond to the passive, active and intermediate positions of the fuse box.

12. The cut-off device according to claim 11, wherein the handle of the fuse box comprises a locking area at its free end, arranged so as to fit in a complementary locking area provided on the cut-off device, when the fuse box is moved from the passive position to the active position.

13. The cut-off device according to claim 12, wherein the handle of the fuse box comprises a lever, at its free end, arranged to cooperate with a bearing surface provided on the cut-off device in order to remove the fuse box from the cut-off device, when the handle is operated from the active position to the intermediate position.

14. The cut-off device according to claim 11, wherein the fuse box comprises means for padlocking the intermediate position so as to allow locking out the cut-off device.

15. The cut-off device according to claim 7, further comprising at least two current lines, each current line being made of a pair of fixed contacts associated with a movable contact, and a fuse box being assigned to each current line, wherein the handles of the fuse boxes are linked together.

16. The cut-off device according to claim 7, wherein the operating device of the movable electrical contacts of the cut-off device is coupled with the handle of the fuse box by movement transmission means arranged so as to move the fuse box between at least the intermediate and the active positions, and vice versa, by actuating only the operating device between its open position and a third disconnected position.

17. The cut-off device according to claim 16, wherein the movement transmission means comprise at least one slide running in a cam groove, the slide and the cam groove are respectively provided on the cut-off device and on the fuse box, or vice versa, the cam groove defines a path for the slide without an effect on the fuse box in active position when operating device switches between the closed and the open position, and a stop for the slide causes the displacement of the fuse box between the active and the intermediate position, when operating device switches between the open and the disconnected position.

* * * * *